(12) United States Patent
Saito et al.

(10) Patent No.: US 7,157,748 B2
(45) Date of Patent: Jan. 2, 2007

(54) NITRIDE-BASED SEMICONDUCTOR DEVICE

(75) Inventors: Wataru Saito, Kawasaki (JP); Ichiro Omura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 133 days.

(21) Appl. No.: 11/014,866

(22) Filed: Dec. 20, 2004

(65) Prior Publication Data
US 2006/0054924 A1  Mar. 16, 2006

(30) Foreign Application Priority Data
Sep. 16, 2004  (JP) .............................. 2004-269955

(51) Int. Cl.
*H01L 31/00* (2006.01)
(52) U.S. Cl. ...................... 257/192; 257/194
(58) Field of Classification Search ................ 257/192, 257/194
See application file for complete search history.

(56) References Cited

U.S. PATENT DOCUMENTS

| | | | |
|---|---|---|---|
| 6,534,801 B1 | 3/2003 | Yoshida | |
| 6,548,333 B1 | 4/2003 | Smith | |
| 6,586,781 B1 | 7/2003 | Wu et al. | |
| 6,690,042 B1 | 2/2004 | Khan et al. | |

FOREIGN PATENT DOCUMENTS

| | | |
|---|---|---|
| JP | 7-135220 | 5/1995 |
| JP | 11-145157 | 5/1999 |
| JP | 2001-284576 | 10/2001 |
| JP | 2002-184972 | 6/2002 |
| JP | 2002-289837 | 10/2002 |
| JP | 2003-258005 | 9/2003 |

*Primary Examiner*—Sara Crane
(74) *Attorney, Agent, or Firm*—Oblon, Spivak, McClelland, Maier & Neustadt, P.C.

(57) ABSTRACT

A nitride-based semiconductor device includes a first semiconductor layer consisting essentially of a nitride-based semiconductor, and a second semiconductor layer disposed on the first semiconductor layer and consisting essentially of a non-doped or first conductivity type nitride-based semiconductor. The first and second semiconductor layers forms a hetero-interface. A gate electrode is disposed on the second semiconductor layer. First and second trenches are formed in a surface of the second semiconductor layer at positions sandwiching the gate electrode. Third and fourth semiconductor layers of the first conductivity type are respectively formed in surfaces of the first and second trenches and each consist essentially of a diffusion layer having a resistivity lower than the first and second semiconductor layers. Source and drain electrodes are electrically connected to the third and fourth semiconductor layers, respectively.

18 Claims, 6 Drawing Sheets

NITRIDE-BASED SEMICONDUCTOR DEVICE

CROSS-REFERENCE TO RELATED APPLICATIONS

This application is based upon and claims the benefit of priority from prior Japanese Patent Application No. 2004-269955, filed Sep. 16, 2004, the entire contents of which are incorporated herein by reference.

BACKGROUND OF THE INVENTION

1. Field of the Invention

The present invention relates to a nitride-based semiconductor device, and particularly to a lateral power FET (FET: Field-Effect Transistor) used for controlling electric power.

2. Description of the Related Art

A circuit, such as a switching power supply or inverter, employs a power semiconductor device, such as a switching device or diode. The power semiconductor device needs to have a high breakdown voltage and low ON-resistance. The relationship between the breakdown voltage and ON-resistance includes a tradeoff relationship determined by the device material. Progress in technical development so far has allowed the power semiconductor device to have a low ON-resistance close to the limit determined by silicon, which is the main device material. Accordingly, it is necessary to change the device material, if a lower ON-resistance is required.

In recent years, attention is being given to research on a power semiconductor device using a wide band-gap semiconductor. For example, it has been proposed to use a wide band-gap semiconductor, such as a nitride-based material (e.g., GaN, AlGaN) or a silicon carbide-based material (SiC), as a switching device material, in place of silicon. The use of such a semiconductor can improve the ON-resistance/breakdown voltage tradeoff relationship determined by the device material, thereby remarkably reducing the ON-resistance. For example, HFET (HFET: Hetero-FET) having a hetero-structure formed by a GaN channel layer and an AlGaN barrier layer can realize a power FET with a high breakdown voltage/low ON-resistance.

Brief explanation will be given of the following publications listed as related arts.

[Patent publication 1] Jpn. Pat. Appln. KOKAI Publication No. 2002-184972

[Patent publication 2] Jpn. Pat. Appln. KOKAI Publication No. 2002-289837

[Patent publication 3] Jpn. Pat. Appln. KOKAI Publication No. 2001-284576

[Patent publication 4] Jpn. Pat. Appln. KOKAI Publication No. 11-145157

[Patent publication 5] Jpn. Pat. Appln. KOKAI Publication No. 07-135220

[Patent publication 6] Jpn. Pat. Appln. KOKAI Publication No. 2003-258005

[Patent publication 7] U.S. Pat. No. 6,534,801

[Patent publication 8] U.S. Pat. No. 6,690,042

[Patent publication 9] U.S. Pat. No. 6,586,781

[Patent publication 10] U.S. Pat. No. 6,548,333

The patent publications 1 and 7 disclose a HEMT (HEMT: High Electron Mobility Transistor) having an AlGaN channel layer, GaN buffer layer, and n-type GaN source/drain layer. The patent publication 3 discloses a HEMT having an AlGaN electron supply layer, and GaN electron accumulation layer. The patent publication 6 discloses a HEMT using an AlGaN/GaN hetero-junction.

The patent publication 2 discloses an FET having an AlGaN electron supply layer, GaN buffer layer, and n-type GaN source/drain layer. The patent publications 8 to 10 disclose a HFET having AlGaN/GaN junction layers to generate two dimensional electron gas.

The patent publication 4 discloses a GaAs-based FET having an embedded region to improve the breakdown voltage between the gate and drain. The patent publication 5 discloses a GaAs-based FET having a trench formed in the drain region and an electrode disposed in the trench to improve the breakdown voltage of the drain region.

BRIEF SUMMARY OF THE INVENTION

According to a first aspect of the present invention, there is provided a nitride-based semiconductor device comprising:

a first semiconductor layer consisting essentially of a nitride-based semiconductor;

a second semiconductor layer disposed on the first semiconductor layer and consisting essentially of a non-doped or first conductivity type nitride-based semiconductor, the first and second semiconductor layers forming a hetero-interface;

a gate electrode disposed on the second semiconductor layer;

first and second trenches formed in a surface of the second semiconductor layer at positions sandwiching the gate electrode;

third and fourth semiconductor layers of the first conductivity type respectively formed in surfaces of the first and second trenches and each consisting essentially of a diffusion layer having a resistivity lower than the first and second semiconductor layers;

a source electrode electrically connected to the third semiconductor layer; and a drain electrode electrically connected to the fourth semiconductor layer.

According to a second aspect of the present invention, there is provided a nitride-based power semiconductor device comprising:

a first semiconductor layer of non-doped $Al_XGa_{1-X}N$ ($0 \leq X \leq 1$);

a second semiconductor layer of non-doped or n-type $Al_YGa_{1-Y}N$ ($0 \leq Y \leq 1$, $X<Y$) disposed on the first semiconductor layer, the first and second semiconductor layers forming a hetero-interface;

a source electrode and a drain electrode disposed separately from each other and each electrically connected to the first semiconductor layer;

a gate electrode disposed on the second semiconductor layer between the source electrode and the drain electrode;

a drain-side trench formed in a surface of the second semiconductor layer at a position corresponding to the drain electrode; and a drain contact layer formed in a surface of the drain-side trench and consisting of an n-type semiconductor diffusion layer having a resistivity lower than the first and second semiconductor layers, the drain electrode being in ohmic contact with the drain contact layer within the drain-side trench.

DETAILED DESCRIPTION OF THE INVENTION

Figure 1:
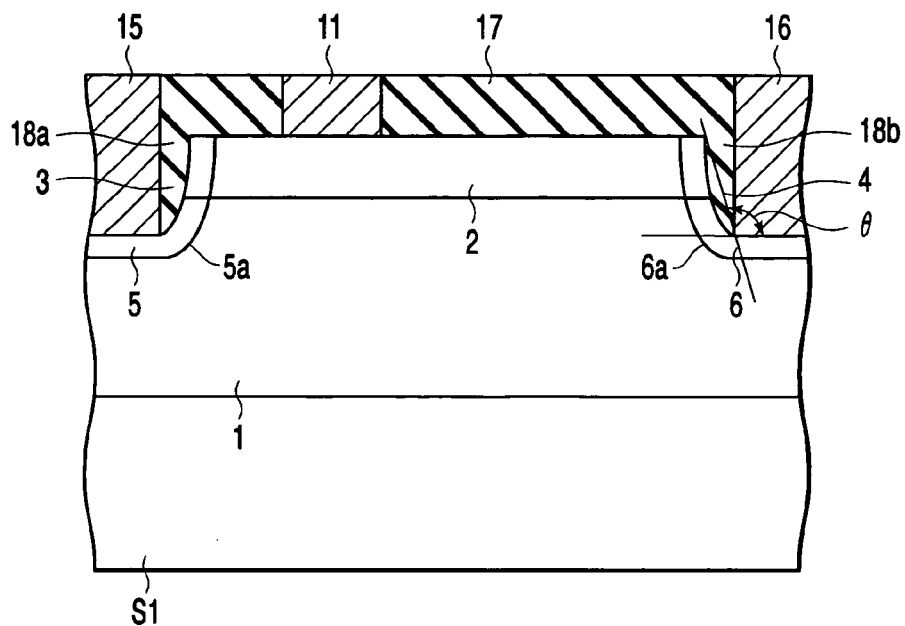
FIG. 1 is a sectional view schematically showing a nitride-based power semiconductor device (GaN-based HFET) according to a first embodiment of the present invention.

In the process of developing the present invention, the inventors studied conventional GaN-based power HFETs, and so forth. As a result, the inventors have arrived at the findings given below.

In order to obtain a high breakdown voltage in GaN-based HFETs, it is effective to use a non-doped $Al_\alpha Ga_{1-\alpha}N$ ($0 \leq \alpha \leq 1$) as a barrier layer. However, in this case, the contact resistance of an electrode relative to the non-doped $Al_\alpha Ga_{1-\alpha}N$ ($0 \leq \alpha \leq 1$) layer is high, and thus brings about difficulty in obtaining a low ON-resistance. If the ohmic contact state of an electrode relative to the non-doped $Al_\alpha Ga_{1-\alpha}N$ ($0 \leq \alpha \leq 1$) layer is unstable, the ON-resistances of devices differ from each other.

Furthermore, the breakdown voltage of lateral devices, such as GaN-based HFETs, is determined by the electric field distribution between the gate and drain. Particularly, in view of reducing the ON-resistance, where the distance between the gate and drain is set shorter, electric field concentration at the drain electrode end is an important factor to determine the breakdown voltage.

In order to solve this problem, it is effective to interpose an n⁺-type contact layer between the non-doped $Al_\alpha Ga_{1-\alpha}N$ ($0 \leq \alpha \leq 1$) layer and the electrode. However, GaN-based materials do not allow deep diffusion, but allow only a shallow diffusion layer up to about 10 nm. For this reason, in general, where a contact layer is made of a GaN-based material, the selective growth technique is used. However, where the process is combined with selective growth, the process becomes unfavorably complicated.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

<First Embodiment>

FIG. 1 is a sectional view schematically showing a nitride-based power semiconductor device (GaN-based HFET) according to a first embodiment of the present invention. As shown in FIG. 1, this HFET includes a channel layer (first semiconductor layer) 1 of the non-doped type disposed on a support substrate S1 of sapphire, and a barrier layer (second semiconductor layer) 2 of the non-doped or n-type disposed on the channel layer 1. The channel layer 1 consists of $Al_X Ga_{1-X}N$ ($0 \leq X \leq 1$), e.g., GaN. The barrier layer 2 consists of $Al_Y Ga_{1-Y}N$ ($0 \leq Y \leq 1$, X<Y), e.g., $Al_{0.2}Ga_{0.8}N$. The barrier layer 2 has a thickness of, e.g., about 30 nm.

A gate electrode 11 is disposed on the barrier layer 2 in Schottky contact with the barrier layer 2, and thus the gate electrode 11 faces the channel layer 1 through the barrier layer 2. A source electrode 15 and a drain electrode 16 are disposed with a gate electrode 11 interposed therebetween. The source electrode 15 and drain electrode 16 are electrically connected to the channel layer 1 in the following manner.

Specifically, a source-side trench 3 and a drain-side trench 4 are formed in the surface of the barrier layer 2 to correspond to the source electrode 15 and drain electrode 16, respectively. A source contact layer 5 and a drain contact layer 6 are respectively formed in the inner surface of the trenches 3 and 4. Each of the two contact layers 5 and 6 is formed of an n⁺-type diffusion layer having a lower resistivity than the channel layer 1 and barrier layer 2. The source electrode 15 and drain electrode 16 are respectively disposed in ohmic contact with (electrically connected to) the contact layers 5 and 6 within the trenches 3 and 4.

In this embodiment, the electrodes 15 and 16 form contact with the contact layers 5 and 6 essentially only at the bottoms thereof, and their sides are separated from the inner surfaces of the trenches 3 and 4. Embedded insulating layers 18a and 18b, which are parts of an insulating layer 17 are respectively interposed between the sides of the electrodes 15 and 16 and the inner surfaces of the trenches 3 and 4. The insulating layer 17 is disposed to cover the entire structure described above.

For example, the two trenches 3 and 4 have substantially the same depth, and are formed by etching together in a common step. The depth of the trenches 3 and 4 is preferably set to be within a range of from 10 nm to 300 nm, and more preferably to be deeper than the interface (about 30 nm) between the channel layer 1 and barrier layer 2. Furthermore, the depth of the trenches 3 and 4 is preferably set to be within a range of from 0.1% to 3% of the distance between the gate electrode 11 and drain contact layer 6, and more preferably of from 0.3% to 2% of the distance. Setting the depth of the trenches, as described above, it is possible to attain the effects of substantially increasing the breakdown voltage and reducing the ON-resistance. The reason for this will be described later, with reference to FIG. 2 and so forth.

A diffusion layer can naturally have a suitable curvature at a corner when it is formed. Accordingly, the bottom corner shapes of the trenches 3 and 4 do not suffer severe restriction in order to obtain a certain curvature at the corners 5a and 6a of the contact layers 5 and 6. However, the trenches 3 and 4 are preferably prepared such that the inner angle θ formed between the bottom surface and the side surface is 90° or more. The purpose of forming the corners of the contact layers to have a suitable curvature resides in relaxing the electric field concentration at the end of the drain electrode. Accordingly, the curvature at the corner 5a of the source contact layer 5 is not important.

The device according to the first embodiment includes the contact layers 5 and 6, which are formed of $n^+$-type diffusion layers and have an effectively large depth. This allows the device not only to have a low ON-resistance, but also to have a stable high breakdown voltage. Specifically, the contact layers 5 and 6 formed of $n^+$-type diffusion layers reduce the contact resistance relative to the electrodes 15 and 16, thereby reducing the ON-resistance. Furthermore, the contact layer 6 formed of a deep $n^+$-type diffusion layer relaxes the electric field concentration at the end of the drain electrode 16 by the curvature of the diffusion layer corner 6a, thereby realizing a high breakdown voltage.

The effectively deep diffusion layer can be formed by a simple process of etching a trench and then performing solid phase diffusion into the trench. With this process, the diffusion layer comes to have a large curvature, so as to reliably relax the electric field concentration at the end of the drain electrode 16. The etching can be controlled to form the trench with high reproducibility, so as to realize a stable breakdown voltage.

In this respect, GaN-based materials do not allow deep diffusion, but allow only a shallow diffusion layer up to about 10 nm. For this reason, in general, where a contact layer is made of a GaN-based material, selective growth technique is used. However, where the process is combined with selective growth, the process becomes unfavorably complicated.

In a case where no diffusion layer (contact layer) is formed or a shallow diffusion layer is used, the curvature at the end of the drain electrode 16 is close to zero, and electric field concentration tends to occur thereon. In addition, the degree of the electric field concentration easily varies, depending on the shape of the electrode, and makes it difficult to obtain a stable breakdown voltage. Furthermore, in this case, an electric field is large near the interface between the device surface and an insulating layer covering it (for example, an inter-level insulating film or passivation film). If a large electric field is applied to the insulating layer, problems may arise such that the insulating layer is broken, and the characteristics vary due to carriers trapped at the interface energy level.

On the other hand, in the device according to the first embodiment, the contact layer 6 formed of a deep $n^+$-type diffusion layer shifts the peak of the electric field to the bottom of the contact layer 6. As a consequence, the electric field applied to the insulating layer covering the device surface becomes smaller, thereby improving the reliability of the device.

To summarize, a structure prepared by etching a trench and then forming a diffusion layer (contact layer) therein is equivalent to a structure with an effectively deep diffusion layer. The electric field concentration at the end of the drain electrode can be controlled, using the etched shape of the trench as a parameter. As a consequence, it is possible to provide a device with a low contact resistance and a stable breakdown voltage. In addition, the avalanche point comes down to the bottom of the diffusion layer (contact layer), and the electric field on the device surface becomes smaller, thereby improving the reliability.

Figure 2:
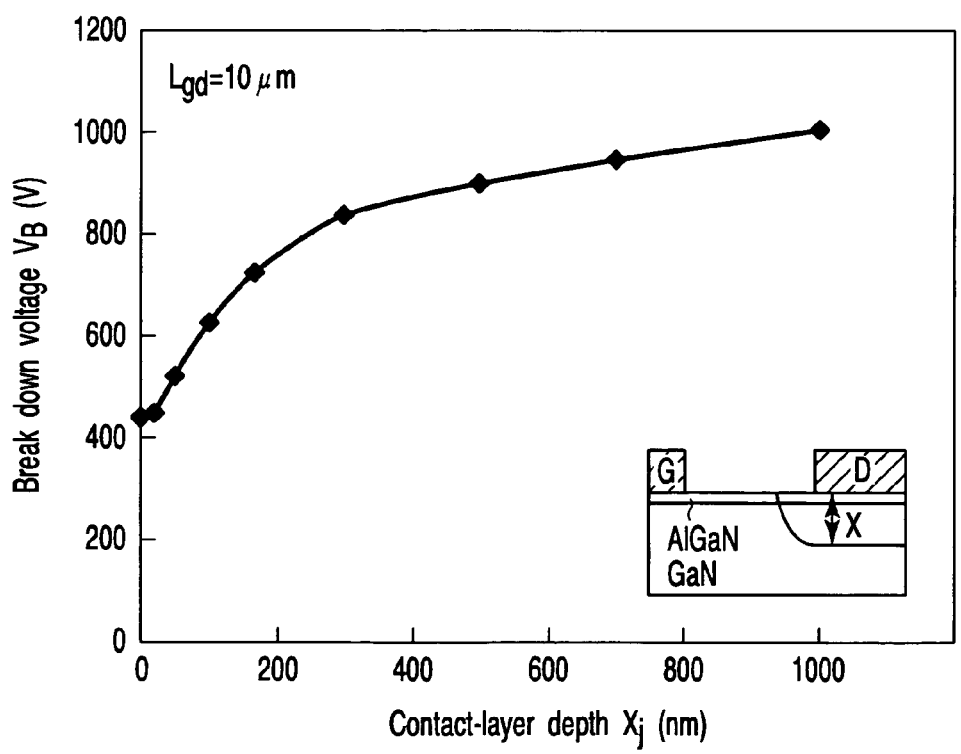
FIG. 2 is a graph showing the relationship between the contact-layer depth (depth from the surface of a barrier layer) and breakdown voltage in a GaN-based HFET.

FIG. 2 is a graph showing the relationship between the depth of the contact layer 6 (depth from the surface of the barrier layer 2) and breakdown voltage in a GaN-based HFET. In this graph, the channel layer 1 consists of GaN, and the barrier layer 2 consists of $Al_{0.2}Ga_{0.8}N$. The barrier layer 2 has a thickness of about 30 nm, and the contact layer 6 has a thickness of about 10 nm. The distance Lgd between the gate electrode 11 and drain electrode 16 (contact layer 6) is 10 μm.

As shown in FIG. 2, as the depth of the contact layer 6 increases, the electric field is more relaxed, and the breakdown voltage is thereby higher. More specifically, this effect is small until the depth of the contact layer 6 reaches about 20 nm, and, on the other hand, it is saturated over 300 nm. Accordingly, in consideration of a diffusion layer depth of about 10 nm obtained by solid phase diffusion into GaN-based materials, the etched depth of the trench 4 is preferably set to be within a range of from 10 nm to 300 nm.

Where the distance Lgd between the gate and drain changes, the optimum depth of the contact layer 6 and the optimum depth of the trench 4 also change by the same scaling. Provided that the optimum depth of the trench 4 is within a range of from 10 to 300 nm for an Lgd of 10 μm, the optimum depth of the trench 4 is expressed by a range of from about 0.1 to 3% of the Lgd.

In light of a lower ON-resistance, the drain electrode 16 is in contact with the contact layer 6 preferably at a position corresponding to the two dimensional electron gas (2DEG) channel at the hetero-interface between the channel layer 1 and barrier layer 2, i.e., the AlGaN/GaN hetero-interface in the first embodiment. Accordingly, from this viewpoint, the trench 4 is preferably set deeper than the interface between the channel layer 1 and barrier layer 2. This concept regarding trench depth is also applicable to the trench 3 on the source side in the same way.

Thus, in order to reduce the ON-resistance, the depth of the trenches is preferably set larger than the thickness of the barrier layer 2. Where the thickness of the barrier layer 2 is about 30 nm, as described above, the optimum depth of the trench 4 is 0.3% or more of the Lgd=10 μm. Furthermore, in the case of mesa isolation by etching, the etching reaches a depth of about 200 nm, in general. Where this depth is applied to the trench 4, the optimum depth of the trench 4 is 2% or less of the Lgd=10 μm.

Figure 3A:
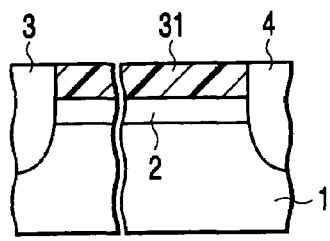
FIGS. 3A to 3D are sectional views showing steps of a method of manufacturing the device shown in FIG. 1, in order.
Figure 3B:
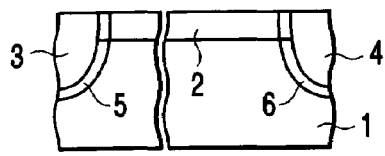

FIGS. 3A to 3D are sectional views showing steps of a method of manufacturing the device shown in FIG. 1, in order. First, as shown in FIG. 3A, etching is performed, using a photo-resist layer 31 as a mask, to form the trenches 3 and 4, which have a depth extending from the surface of the barrier layer 2 into the channel layer 1. Then, as shown in FIG. 3B, the photo-resist layer 31 is removed, and an n-type impurity is thermally diffused into the inner surfaces of the trenches 3 and 4 to form $n^+$-type diffusion layers as the contact layers 5 and 6.

Figure 3C:
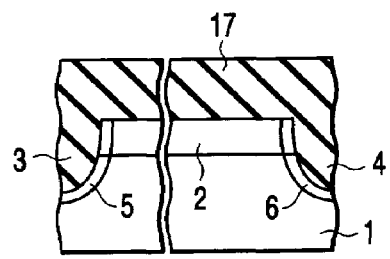

Then, as shown in FIG. 3C, the insulating layer 17 is formed over the entire barrier layer 2 to fill the trenches 3 and 4. The insulating layer 17 may be an inter-level insulating film where a multi-layer wiring structure or a field plate electrode described later is formed, or it may otherwise be a so-called passivation film itself.

Figure 3D:
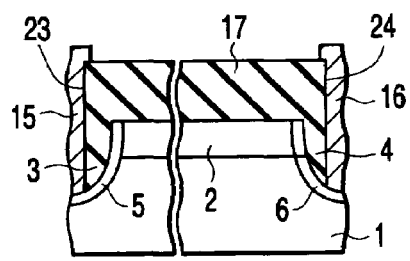

Then, as shown in FIG. 3D, contact holes 23 and 24 are formed in the insulating layer 17 at positions corresponding to the trenches 3 and 4, so that they have a depth reaching the contact layers 5 and 6. Then, the electrodes 15 and 16 are formed to fill the contact holes 23 and 24. The contact holes 23 and 24 and the electrodes 15 and 16 may be formed, using well known photo-lithography techniques.

In the structure formed by this method, the electrodes 15 and 16 can be separated from the edge of the trenches 3 and 4, so that each of the source electrode 15 and drain electrode 16 is sufficiently distant from the gate electrode 11. As a consequence, even where the device needs to be smaller, it is possible to prevent short-circuiting of electrodes, by suitably setting the positions and dimensions of the contact holes 23 and 24.

Figure 3E:
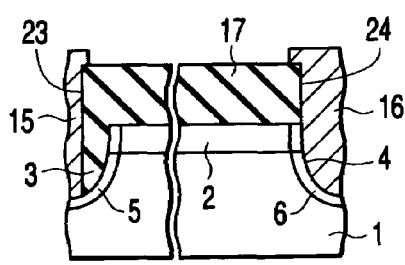
FIG. 3E is a sectional view showing a modification obtained by altering the drain side structure of the device shown in FIG. 1.

FIG. 3E is a sectional view showing a modification obtained by altering the drain side structure of the device shown in FIG. 1. In this modification, the contact hole 24 aligns with the edge of the trench 4, and the side of the drain electrode 16 is in ohmic contact with the inner surface of the trench 4 over substantially the entire length thereof. In this case, the drain electrode 16 is in contact with the contact layer 6 at a position corresponding to the two dimensional electron gas (2DEG) channel at the hetero-interface between the channel layer 1 and barrier layer 2, and the ON-resistance is thereby reduced.

The distance between the gate electrode 11 and source electrode 15 is, e.g., about 1 μm, while the distance between the gate electrode 11 and drain electrode 16 is, e.g., about 10 μm, which is far larger than the former one. Accordingly, even if the contact hole 24 aligns with the edge of the trench 4 or further projects toward the gate electrode 11, short-circuiting of electrodes is unlikely to occur on the drain side.

As described above, the electrode structures on the source side and the drain side may differ from each other, in accordance with their necessary characteristics (for example, the contact-layer depth is particularly important on the drain side, as described above). Unless short-circuiting of electrodes occurs, the source side may have the same electrode structure as the drain side. Specifically, in this case, the contact hole 23 aligns with the edge of the trench 3, and the side of the source electrode 15 is in ohmic contact with the inner surface of the trench 3 over substantially the entire length thereof.

Figure 4A:
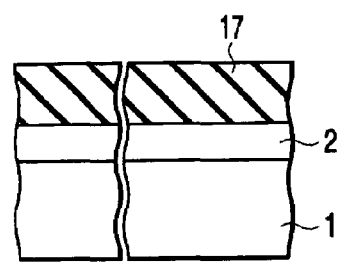
FIGS. 4A to 4D are sectional views showing steps of another method of manufacturing the device shown in FIG. 1, in order.
Figure 4B:
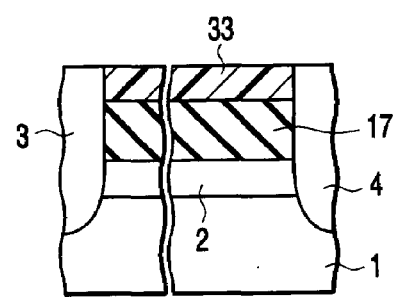

FIGS. 4A to 4D are sectional views showing steps of another method of manufacturing the device shown in FIG. 1, in order. First, as shown in FIG. 4A, the insulating layer 17 is formed over the entire barrier layer 2. The insulating layer 17 may be an inter-level insulating film where a multi-layer wiring structure or a field plate electrode described later is formed, or it may otherwise be a so-called passivation film itself. Then, as shown in FIG. 4B, etching is performed, using a photo-resist layer 33 as a mask, to form the trenches 3 and 4, which have a depth extending from the surface of the insulating layer 17 through the barrier layer 2 into the channel layer 1.

Figure 4C:
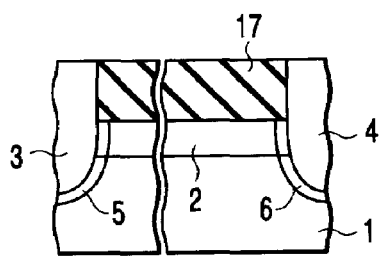
Figure 4D:
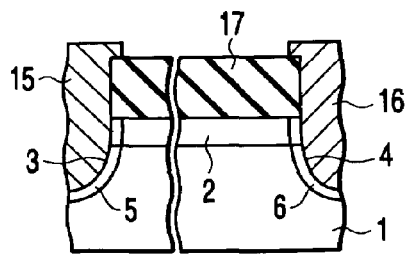

Then, as shown in FIG. 4C, the photo-resist layer 33 is removed. Then, an n-type impurity is thermally diffused into the surfaces of the barrier layer 2 and channel layer 1 in the trenches 3 and 4 to form $n^+$-type diffusion layers as the contact layers 5 and 6. Then, as shown in FIG. 4D, the electrodes 15 and 16 are formed to fill the trenches 3 and 4.

In the structure formed by this method, the side of each of the electrodes 15 and 16 is in ohmic contact with the inner surface of the corresponding one of the trenches 3 and 4 over substantially the entire length thereof. In this case, as described above, the electrodes 15 and 16 are respectively in contact with the contact layers 5 and 6 at positions corresponding to the two dimensional electron gas (2DEG) channel at the hetero-interface between the channel layer 1 and barrier layer 2, and the ON-resistance is thereby reduced.

<Second Embodiment>

Figure 5:
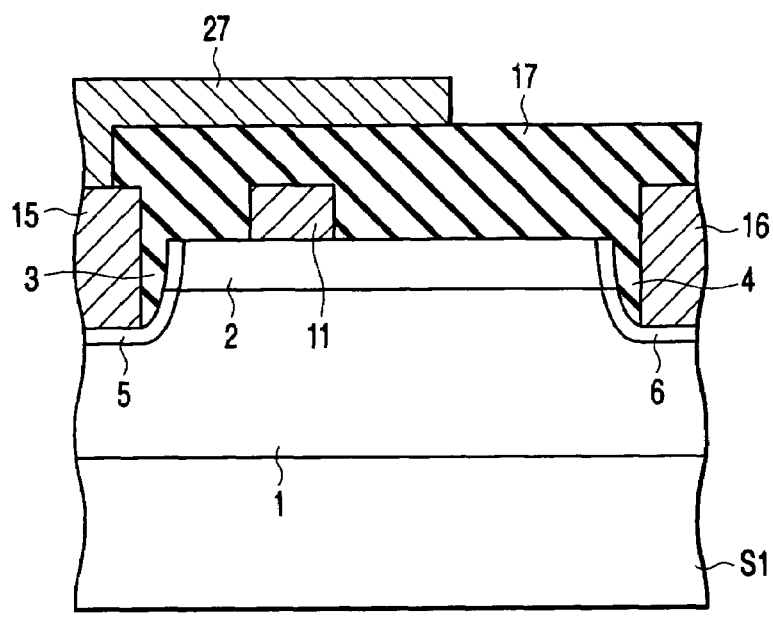
FIG. 5 is a sectional view schematically showing a nitride-based power semiconductor device (GaN-based HFET) according to a second embodiment of the present invention.

FIG. 5 is a sectional view schematically showing a nitride-based power semiconductor device (GaN-based HFET) according to a second embodiment of the present invention. As shown in FIG. 5, an insulating layer 17 is disposed on a barrier layer 2 to cover a gate electrode 11 and so forth. Further, a first field plate electrode 27 is disposed on the insulating layer 17 to cover the gate electrode 11. The first field plate electrode 27 is integratedly formed with the source electrode 15 and thereby electrically connected thereto. The first field plate electrode 27 covers the gate electrode 11 to relax the electric field concentration at the end of the gate electrode 11, so that a stable breakdown voltage is realized.

<Third Embodiment>

Figure 6:
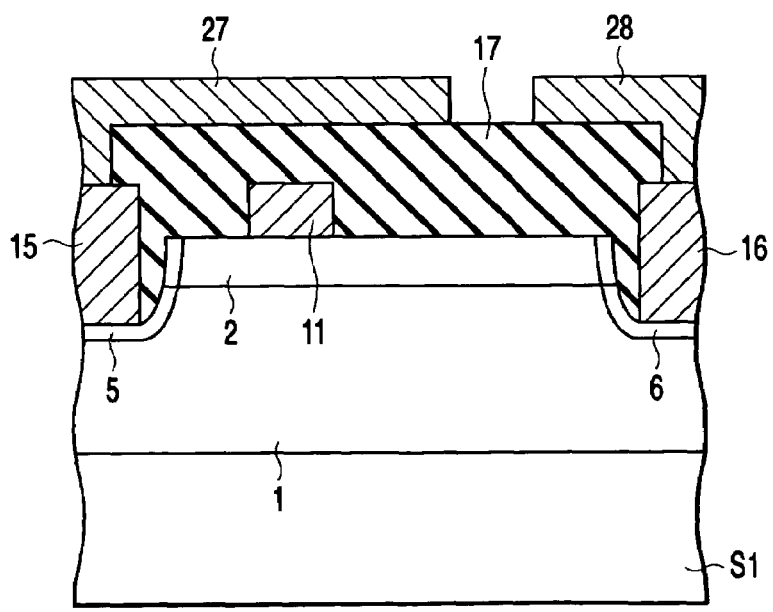
FIG. 6 is a sectional view schematically showing a nitride-based power semiconductor device (GaN-based HFET) according to a third embodiment of the present invention.

FIG. 6 is a sectional view schematically showing a nitride-based power semiconductor device (GaN-based HFET) according to a third embodiment of the present invention. As shown in FIG. 6, in addition to the structure shown in FIG. 5, a second field plate electrode 28 is disposed on an insulating layer 17 on the drain side. The second field plate electrode 28 is integratedly formed with the drain electrode 16 and thereby electrically connected thereto. The field plate electrode 28 further disposed on the drain side can relax the electric field concentration on the drain side as a deeper diffusion layer does, so that a high breakdown voltage is realized.

<Fourth Embodiment>

Figure 7A:
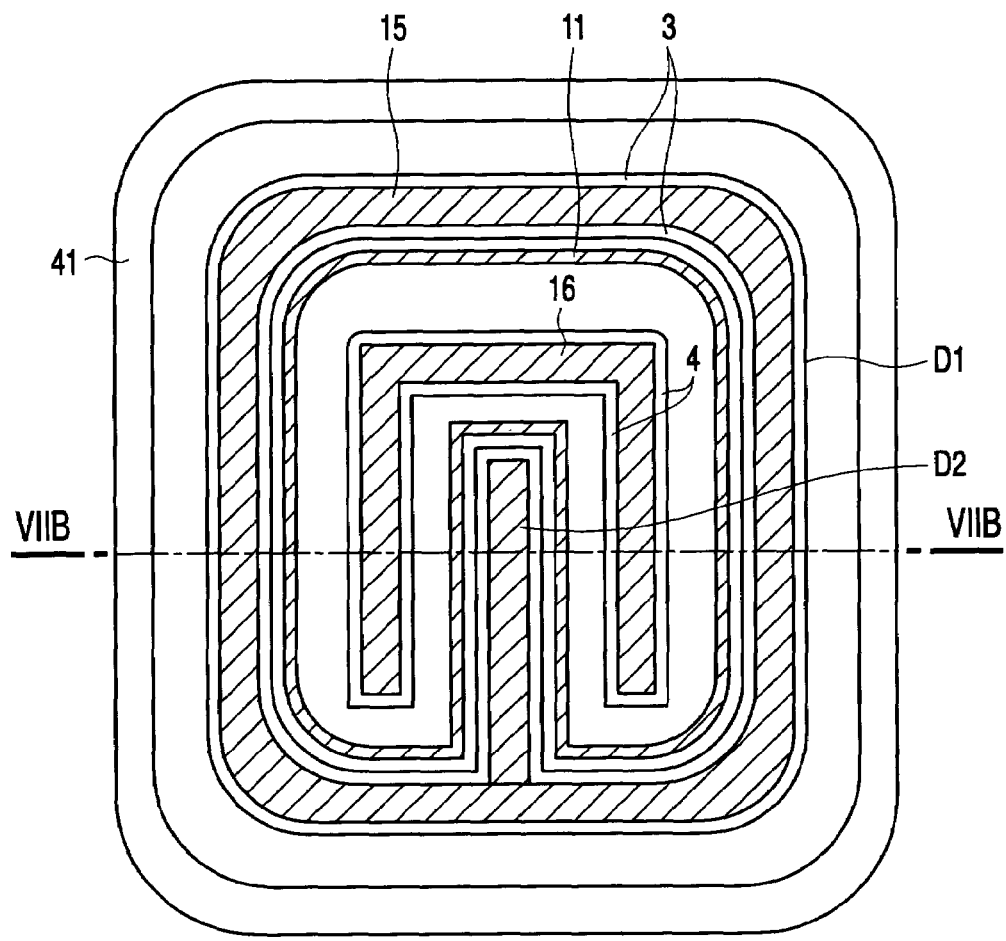
FIG. 7A is a plan view schematically showing a nitride-based power semiconductor device (GaN-based HFET) according to a fourth embodiment of the present invention.
Figure 7B:
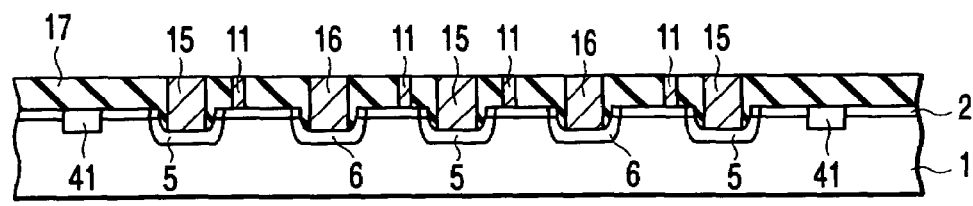
FIG. 7B is a sectional view taken along a line VIIB—VIIB in FIG. 7A.

FIG. 7A is a plan view schematically showing a nitride-based power semiconductor device (GaN-based HFET) according to a fourth embodiment of the present invention. FIG. 7B is a sectional view taken along a line VIIB—VIIB in FIG. 7A. FIGS. 7A and 7B show substantially the entire layout of one chip.

Particularly shown in the plan view layout of FIG. 7A, a trench 4, contact layer 6, and drain electrode 16 on the drain side are disposed at the center of the device and have a U-shape. These drain-side portions 4, 6, and 16 are surrounded by a gate electrode 11 forming a U-shaped loop. The gate electrode 11 is surrounded by a trench 3, contact layer 5, and source electrode 15 on the source side. The source-side portions 3, 5, and 15 are formed of a loop portion D1 and a linear portion D2 disposed in the concave of the U-shaped loop of the gate electrode 11.

A device isolation layer 41 is disposed to surround the source-side portions 3, 5, and 15, i.e., to surround the entire device, at a position close to the outer edge of the chip. The device isolation layer 41 is a high resistivity layer formed by nitrogen ion implantation and extending from the surface of a barrier layer 2 into a channel layer 1. The high resistivity layer forming the device isolation layer 41 has a resistivity almost equal to or higher than that of the GaN channel layer 1. The device isolation layer 41 needs to be deeper than the two dimensional electron gas (2DEG) channel at the hetero-interface between the channel layer 1 and barrier layer 2.

The sectional structure shown in FIG. 7B is arranged essentially in accordance with the structure shown in FIG. 1, but may be modified in accordance with those explained with reference to FIG. 3E and FIGS. 4A to 4D. The electrode structures on the source side and the drain side may differ from each other in terms of, e.g., the width of the electrodes 15 and 16 and the depth of the trenches 3 and 4, in order to obtain the necessary characteristics. These matters about modification are similarly applicable to the following fifth and sixth embodiments.

<Fifth Embodiment>

Figure 8A:
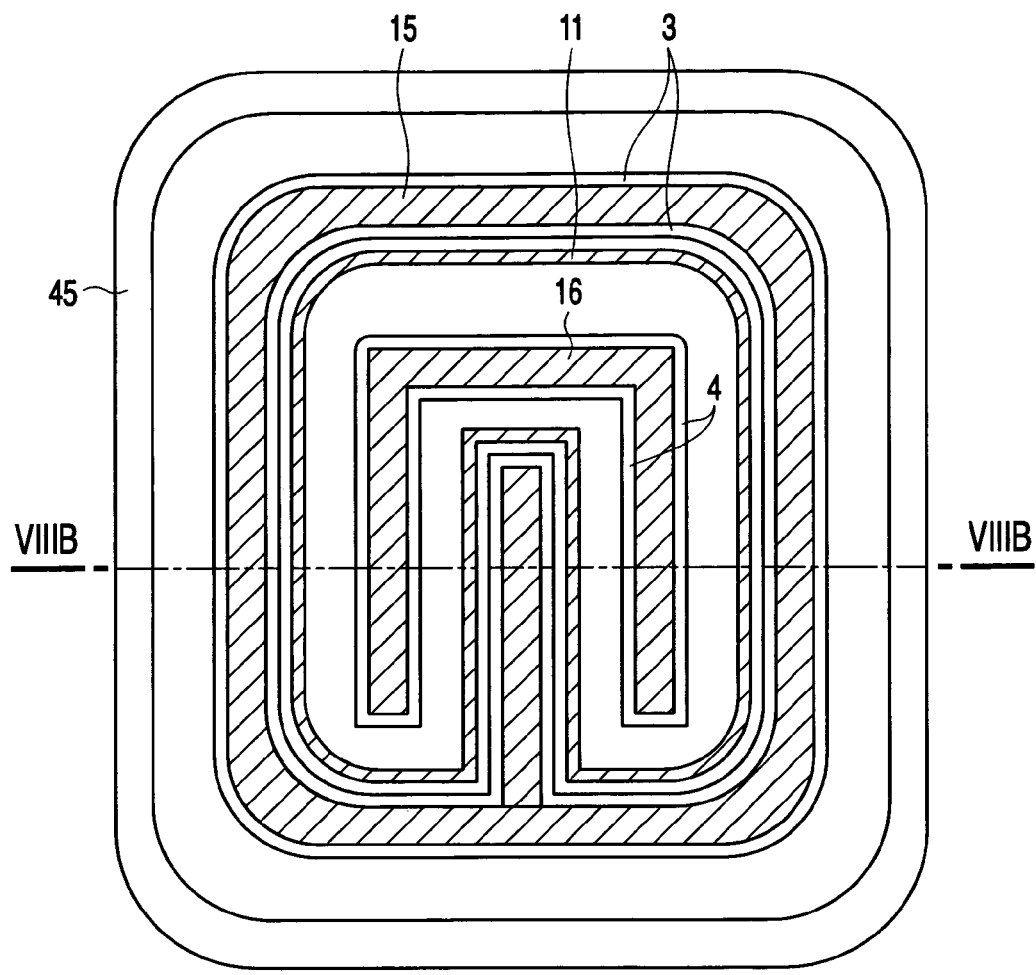
FIG. 8A is a plan view schematically showing a nitride-based power semiconductor device (GaN-based HFET) according to a fifth embodiment of the present invention.
Figure 8B:
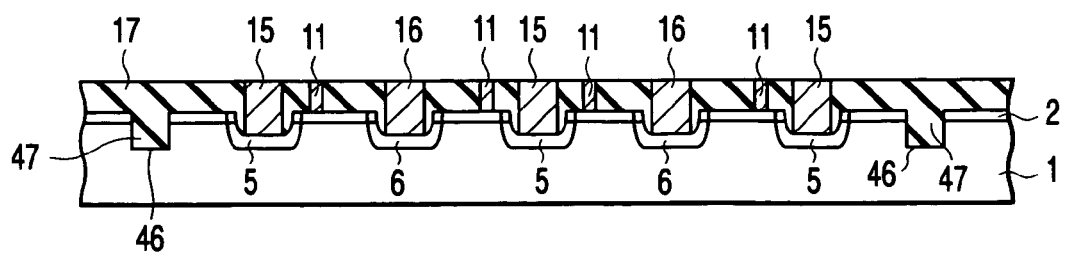
FIG. 8B is a sectional view taken along a line VIIIB—VIIIB in FIG. 8A.

FIG. 8A is a plan view schematically showing a nitride-based power semiconductor device (GaN-based HFET) according to a fifth embodiment of the present invention. FIG. 8B is a sectional view taken along a line VIIIB—VIIIB in FIG. 8A. FIGS. 8A and 8B also show substantially the entire layout of one chip.

As shown in FIG. 8B, this device has a device region defined by mesa isolation by etching. Specifically, an outer trench 46 is formed to surround source-side portions 3, 5, and 15, i.e., to surround the entire device, at a position close to the outer edge of the chip. The outer trench 46 has a depth extending from the surface of a barrier layer 2 into a channel layer 1. The outer trench 46 is filled with an insulating layer 47, which is a part of an insulating layer 17 disposed to cover the entire device. Accordingly, a device isolation layer 45 is formed of the outer trench 46 and embedded insulating layer 47. For example, the outer trench 46 has substantially the same depth as trenches 3 and 4 on the source and drain sides, so that the trench 46 is formed together with the trenches 3 and 4 by etching in a common step.

<Sixth Embodiment>

Figure 9A:
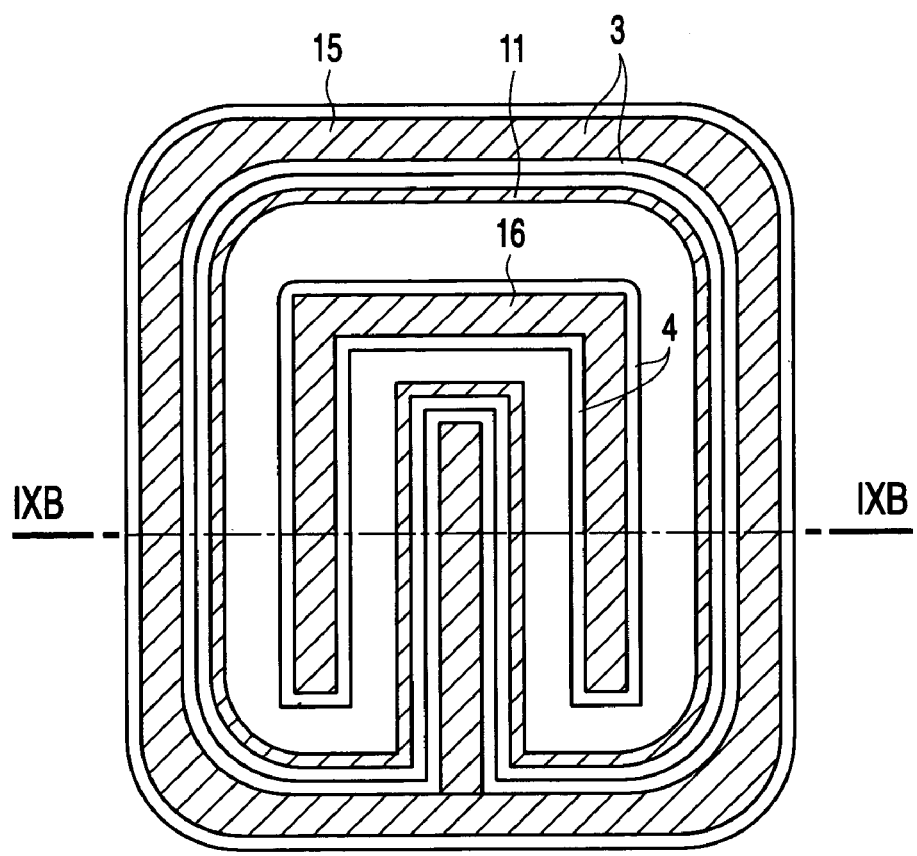
FIG. 9A is a plan view schematically showing a nitride-based power semiconductor device (GaN-based HFET) according to a sixth embodiment of the present invention.
Figure 9B:
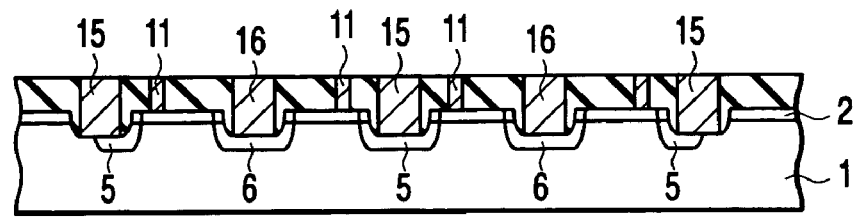
FIG. 9B is a sectional view taken along a line IXB—IXB in FIG. 9A.

FIG. 9A is a plan view schematically showing a nitride-based power semiconductor device (GaN-based HFET) according to a sixth embodiment of the present invention. FIG. 9B is a sectional view taken along a line IXB—IXB in FIG. 9A. FIGS. 9A and 9B also show substantially the entire layout of one chip.

As shown in FIGS. 9A and 9B, this device does not include a device isolation layer independently formed around source-side portions 3, 5, and 15. Alternatively, the outer half of the source-side trench 3 is formed to function as a device isolation region. Specifically, for the outer loop portion, a contact layer 5 is formed only over the inner and bottom sides of the source-side trench 3, and no contact layer is formed on the outer side of the source-side trench 3. As a consequence, this one trench 3 serves for two roles, i.e., formation of a device isolation region and formation of a contact diffusion layer. The device isolation is attained where the two dimensional electron gas (2DEG) channel at the hetero-interface between the channel layer 1 and barrier layer 2 is cut. Accordingly, in this case, the source contact layer 5 is required to be out of contact with the hetero-interface on the outer side.

<Matters Common to the First to Sixth Embodiments>

According to the embodiments described above, it is possible to provide a nitride-based semiconductor device with a high breakdown voltage and a low ON-resistance, by a simple process with high reproducibility.

In the embodiments described above, the channel layer 1 consists of $Al_XGa_{1-X}N$ ($0 \leq X \leq 1$), and the barrier layer 2 consists of $Al_YGa_{1-Y}N$ ($0 \leq Y \leq 1$, $X<Y$). The features of these embodiments, however, may be applied to another nitride-based hetero-structure in which the composition ratios in the component layers are adjusted to form a band-gap different from that described above. For example, such a modification is a structure in which the channel layer 1 consists of InGaN, and the barrier layer 2 consists of GaN, or a structure in which the channel layer 1 consists of GaN, and the barrier layer 2 consists of AlN. The material of the support substrate S1 is not limited to sapphire, and it may be another material.

In the embodiments described above, the nitride-based semiconductor device is exemplified by a HFET. The features of these embodiments, however, may be applied to another field effect device, such as a MESFET (MES: MEtal-Semiconductor) or JFET (J: Junction). Furthermore, the features of the electrode structure on the drain side in the embodiments described above can be widely used for the purpose of improving the breakdown voltage. For example, these features may be applied to a device of another type, such as an insulating gate (MIS gate (MIS: Metal-Insulator-Semiconductor)) structure, or a device of a normally-OFF type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nitride-based semiconductor device comprising:
   a first semiconductor layer consisting essentially of a nitride-based semiconductor;
   a second semiconductor layer disposed on the first semiconductor layer and consisting essentially of a non-doped or first conductivity type nitride-based semiconductor, the first and second semiconductor layers forming a hetero-interface;
   a gate electrode disposed on the second semiconductor layer;
   first and second trenches formed in a surface of the second semiconductor layer at positions sandwiching the gate electrode;
   third and fourth semiconductor layers of the first conductivity type respectively formed in surfaces of the first and second trenches and each consisting essentially of a diffusion layer having a resistivity lower than the first and second semiconductor layers;
   a source electrode electrically connected to the third semiconductor layer;
   a drain electrode electrically connected to the fourth semiconductor layer and
   an insulating layer interposed between a side of at least one electrode of the source electrode and the drain electrode and an inner surface of at least one trench of the first and second trenches, in which said at least one electrode is disposed.

2. The device according to claim 1, wherein the first and second trenches have a depth within a range of from 10 nm to 300 nm.

3. The device according to claim 1, wherein the first and second trenches have a depth deeper than the hetero-interface between the first and second semiconductor layers.

4. The device according to claim 1, wherein the first and second trenches have a depth within a range of from 0.1% to 3% of a distance between the gate electrode and the fourth semiconductor layer.

5. The device according to claim 1, wherein the insulating layer fills said at least one trench, and said at least one electrode is disposed in a contact hole formed in the insulating layer.

6. A nitride-based semiconductor device comprising:
   a first semiconductor layer consisting essentially of a nitride-based semiconductor;
   a second semiconductor layer disposed on the first semiconductor layer and consisting essentially of a non-doped or first conductivity type nitride-based semiconductor, the first and second semiconductor layers forming a hetero-interface;

a gate electrode disposed on the second semiconductor layer;

first and second trenches formed in a surface of the second semiconductor layer at positions sandwiching the gate electrode;

third and fourth semiconductor layers of the first conductivity type respectively formed in surfaces of the first and second trenches and each consisting essentially of a diffusion layer having a resistivity lower than the first and second semiconductor layers;

a source electrode electrically connected to the third semiconductor layer; and a drain electrode electrically connected to the fourth semiconductor layer, wherein, at a position corresponding to the hetero-interface between the first and second semiconductor layers, a side of at least one electrode of the source electrode and the drain electrode is in contact with an inner surface of at least one trench of the first and second trenches, in which said at least one electrode is disposed.

7. The device according to claim 1, further comprising an insulating layer disposed on the second semiconductor layer to cover the gate electrode, and a first field plate electrode disposed on the insulating layer to cover the gate electrode, and electrically connected to the source electrode.

8. The device according to claim 7, further comprising a second field plate electrode disposed on the insulating layer and electrically connected to the drain electrode.

9. The device according to claim 1, wherein the second trench and the drain electrode are surrounded by the gate electrode, and the gate electrode is surrounded by the first trench and the source electrode.

10. The device according to claim 9, further comprising a device isolation layer further surrounding the first trench, wherein the device isolation layer is disposed to extend from a surface of the second semiconductor layer into the first semiconductor layer.

11. The device according to claim 10, wherein the device isolation layer comprises an outer trench formed to extend from a surface of the second semiconductor layer into the first semiconductor layer, and an insulating layer filling the outer trench.

12. The device according to claim 11, wherein the outer trench has substantially the same depth as the first and second trenches.

13. The device according to claim 9, wherein the third semiconductor layer is not formed on an outer side of the first trench, but formed on inner and bottom sides of the first trench.

14. The device according to claim 1, wherein the first semiconductor layer consists essentially of $Al_XGa_{1-X}N$ ($0 \leq X \leq 1$), and the second semiconductor layer consists essentially of $Al_YGa_{1-Y}N$ ($0 \leq Y \leq 1$, $X<Y$).

15. A nitride-based power semiconductor device comprising:

a first semiconductor layer of non-doped $Al_XGa_{1-X}N$ ($0 \leq X \leq 1$);

a second semiconductor layer of non-doped or n type $Al_YGa_{1-Y}N$ ($0 \leq Y \leq 1$, $X<Y$) disposed on the first semiconductor layer, the first and second semiconductor layers forming a hetero-interface;

a source electrode and a drain electrode disposed separately from each other and each electrically connected to the first semiconductor layer;

a gate electrode disposed on the second semiconductor layer between the source electrode and the drain electrode;

a drain-side trench formed in a surface of the second semiconductor layer at a position corresponding to the drain electrode; and a drain contact layer formed in a surface of the drain-side trench and consisting of an n-type semiconductor diffusion layer having a resistivity lower than the first and second semiconductor layers, the drain electrode being in ohmic contact with the drain contact layer within the drain-side trench, wherein the drain electrode is surrounded by the gate electrode, and the gate electrode is surrounded by the source electrode.

16. The device according to claim 15, wherein the drain-side trench has a depth deeper than the hetero-interface between the first and second semiconductor layers but not deeper than 300 nm.

17. The device according to claim 15, wherein the drain-side trench has a depth within a range of from 0.1% to 3% of a distance between the gate electrode and the drain contact layer.

18. The device according to claim 15, further comprising a source-side trench formed in a surface of the second semiconductor layer at a position corresponding to the source electrode and having substantially the same depth as the drain-side trench, and a source contact layer formed in a surface of the source-side trench and consisting of an n-type semiconductor diffusion layer having a resistivity lower than the first and second semiconductor layers, the source electrode being in ohmic contact with the source contact layer within the source-side trench.

* * * * *